United States Patent [19]

Kinashi et al.

[11] Patent Number: 5,681,684
[45] Date of Patent: *Oct. 28, 1997

[54] PHOTOSENSITIVE RESIN COMPOSITION

[75] Inventors: Keiichi Kinashi; Reiko Chiba, both of Kanagawa-ken, Japan

[73] Assignee: National Starch and Chemical Investment Holding Corporation, Wilmington, Del.

[*] Notice: The term of this patent shall not extend beyond the expiration date of Pat. No. 5,512,607.

[21] Appl. No.: 531,026

[22] Filed: Sep. 20, 1995

[51] Int. Cl.⁶ .................................................. G03C 1/725
[52] U.S. Cl. .................................. 430/280.1; 522/103
[58] Field of Search ...................... 430/280.1; 522/103

[56] References Cited

U.S. PATENT DOCUMENTS 5,093,223  3/1992  Iwasawa et al. .................... 430/280
5,468,784  11/1995  Yanagawa et al. ................. 430/280.1
5,512,607  4/1996  Kinashi et al. ...................... 522/100

*Primary Examiner*—Mark Chapman
*Attorney, Agent, or Firm*—Valerie E. Looper

[57] ABSTRACT

To provide a water-developable photosensitive resin composition capable of forming a resist film that excels in hardness, heat resistance and water resistance.

The photosensitive resin composition of this invention is characterized by containing an unsaturated epoxy ester compound which is obtained by reacting the remaining epoxy side group of a partially carboxylic acid-esterified unsaturated epoxy ester compound with an aliphatic tertiary amine in the presence of an alcoholic solvent to convert it into a quaternary ammonium salt.

10 Claims, No Drawings

PHOTOSENSITIVE RESIN COMPOSITION

FIELD OF THE INVENTION

This invention relates to a photosensitive resin composition that contains a photosensitive unsaturated ester compound containing a quaternary ammonium salt, which can be utilized in the coating materials such as encapsulant or adhesives for electronic parts, particularly in the solder resist materials for the production of printed circuit substrates.

BACKGROUND OF THE INVENTION

Because unsaturated epoxy ester resins excel in chemical resistance, water resistance, mechanical property and bondability, they are used mainly for coating, and they are widely used also as the base resin of the liquid photo solder resist material for production of printed circuit substrates. Particularly, since the unsaturated epoxy ester resin with a partially carboxylated glycidyl side group is soluble in an aqueous alkaline solution, no organic solvent is required for development. Furthermore, since its mechanical property and bondability can be improved further by combining with epoxy resin, etc., currently such resin is the main type of resins being used in liquid photo solder resists. However, because organic solvents such as aliphatic esters and aromatic compounds are used to liquefy the resin composition, the commercial manufacturing process has problems in the aspects of odor, air pollution, and effect on human body.

Recently, to solve such problems, various resin systems that employ neutral water in the solvent for development have been investigated for use as the solder resist. For example, although water-borne acrylic resins, whose carboxyl group has been neutralized with an alkali such as an amine, have been proposed, they are yet to be practiced because of the poor heat resistance of the resins. Further, although water-borne resins having a quaternary ammonium salt obtained by reacting epoxy resin with a tertiary amine in the presence of a carboxylic acid such as acetic acid have been reported, it is not desirable from the safety aspect since the carboxylic acid tends to evaporate in the drying process after coating on the substrate.

SUMMARY OF THE INVENTION

As a result of an extensive investigation into developing a new photosensitive resin composition that can solve the above-described problems, the present inventors have discovered that it is possible to use the safe neutral water for development after exposure to actinic light and also possible to use such water as the diluent of the resin composition by using, as the main component, the photosensitive unsaturated ester compound having a quaternary ammonium salt obtained by reacting the epoxy residue group of the unsaturated epoxy ester compound with an aliphatic tertiary amine in an alcoholic solvent to prepare a photosensitive resin composition, and further that a photosensitive resin composition with excellent bondability, water resistance and mechanical strength can be obtained because a quaternary ammonium salt has been introduced in the resin system. Based on these discoveries, the present inventors have finally perfected this invention.

Thus, this invention relates to a photosensitive resin composition containing a photosensitive unsaturated epoxy ester compound, obtained by reacting the residue of the epoxy side group of the unsaturated epoxy ester compound obtained by esterifying part of the epoxy side group of the epoxy compound having two or more epoxy side groups with an unsaturated carboxylic acid, with an aliphatic tertiary amine in the presence of an alcoholic solvent to convert it into a quaternary ammonium salt.

DETAILED DESCRIPTION

The photosensitive unsaturated epoxy ester compound of this invention can be prepared by reacting the epoxy compound having at least two epoxy side groups in the molecule with a polymerizable monocarboxylic acid having one carboxyl group and one ethylenically unsaturated linkage in the molecule to esterify part of the epoxy side groups to prepare an unsaturated epoxy ester compound having an unsaturated ester group and an unreacted epoxy side group, and subsequently reacting the unreacted epoxy side group of the unsaturated epoxy ester compound with an aliphatic tertiary amine in the presence of an alcoholic solvent.

To synthesize the photosensitive unsaturated epoxy ester compound of this invention, first the epoxy compound having at least two epoxy side groups in the molecule is reacted with a polymerizable monocarboxylic acid having one carboxyl group and one ethylenically unsaturated linkage in the molecule to esterify part of the epoxy side groups, to prepare an unsaturated epoxy ester compound having an unsaturated ester group and an unreacted epoxy side group.

Examples of such epoxy group compounds having at least two epoxy side groups in the molecule to be used for such reaction are glycidyl ether type epoxy resin represented by phenol Novolak type epoxy resin and bisphenol A type epoxy resin, glycidyl esters of polyvalent carboxylic acids, and glycidyl amine type epoxy resin. Specific examples are the cresol Novolak type epoxy resin YDCN-704 (product of Toto Kasei K. K., epoxy equivalent weight=200, average molecular weight=1800) and phenol Novolak type epoxy resin EPPN-201 (product of Nippon Kayaku K.K., epoxy equivalent weight=180, average molecular weight=1300). If necessary these epoxy compounds may be used together as a mixture.

Compounds having an ethylenically unsaturated linkage and a carboxyl group in the molecule are used as the polymerizable monocarboxylic acid to react with part of the glycidyl ether side group of the epoxy compound, and preferred examples are acrylic acid, methacrylic acid, crotonic acid, and cinnamic acid. If necessary, the above-said polymerizable monocarboxylic acid may be used together with other carboxylic acids.

The reaction ratio of the epoxy compound and the polymerizable monocarboxylic acid in this invention is COOH/epoxy group=0.1–0.95, preferably 0.3–0.9. If the ratio of the carboxyl group relative to the epoxy group is less than 0.1, photocurability will be poorer. On the other hand, if it exceeds 0.95, photocurability may improve, but the number of remaining epoxy group available for the reaction to synthesize a photosensitive unsaturated ester resin having a quaternary ammonium salt by the subsequent reaction with a tertiary amine will decrease. As a result, water developability of the photosensitive unsaturated ester resin synthesized by the reaction with such components will decline and it will be difficult or impossible to dilute the resin and the composition containing such resin with water.

Examples of the catalyst that can be used in the reaction of epoxy compound and polymerizable monocarboxylic acid in the present invention are amines such as tetraethylammonium bromide, dimethylbenzylamine, tributylamine, imidazole and so on; and organic phosphorous compounds such as triethyl phosphine, tributyl phosphine, and triphenyl phosphine and so on. Even though there is no need to use a reaction solvent in such reaction, a solvent may be used to run the reaction smoothly. In such case, it is desirable to use an alcoholic solvent such as diethyleneglycol monoethyl ether, diethyleneglycol monomethyl ether, ethylene glycol monoethyl ether, ethyleneglycol monomethyl ether, or ethyleneglycol monobutyl ether and so on, because they are relatively free of safety problem. Normally, the reaction is carried out by heating at 50°–150° C., preferably at 70°–120° C., until the reaction of the carboxyl group and the epoxy group has completed and all of the polymerizable monocarboxylic acids have been consumed. In this case, in order to prevent the polymerization of the acrylic group during the reaction, a polymerization inhibitor such as quinone, phenol, polyvalent phenols, and nitro compounds may be used.

In the reaction of the epoxy compound and the polymerizable monocarboxylic acid explained above, part of the unit of the epoxy compound is esterified. Subsequently, the unsaturated epoxy ester compound obtained by this reaction is reacted with an aliphatic tertiary amine in the presence of an alcoholic solvent, to convert the remaining epoxy group in the unsaturated epoxy ester compound into a quaternary ammonium salt.

Although there is no particular restriction, N,N-dimethyl ethanolamine, N-methyl diethanolamine, N-methyl piperidine, N-methyl morpholine, N,N-dimethylaminopropyl acrylamide and so on are the suitable tertiary amines to be used in this reaction, because they have advantageous reactivity.

It is desirable to set the amounts of the reactive components in the reaction, i.e. the amounts of unsaturated epoxy ester compound and the aliphatic tertiary amine, in such a way that the ratio of the remaining epoxy group in the unsaturated epoxy ester compound and the amino group in the aliphatic tertiary amine will be about 1:1. If the quantity ratio of the remaining epoxy group is higher than 1, side reactions may take place which increase the viscosity of the resin. On the other hand, if the ratio is lower than 1, unreacted amine will remain behind, and this will cause an undesirable odor. A preferred reaction temperature is from room temperature to 70° C. If the temperature is lower than room temperature, a longer time will be required for the reaction. And, if the temperature exceeds 70° C., side reaction takes place to gel the resin easily during the reaction. The end point of the reaction can be confirmed by disappearance of epoxy peak by the IR analysis.

It is desirable to run the reaction of the unsaturated epoxy ester compound and the aliphatic tertiary amine of this invention in the presence of an alcoholic solvent, to lower the viscosity of the resin during synthesis and to make it easier to agitate the reaction mixture. Alcoholic solvents being used in the synthesis of unsaturated epoxy ester resins by the reaction of epoxy compound and polymerizable monocarboxylic acid can be used favorably as the alcoholic solvent for this reaction. Incidentally, if an alcoholic solvent is used in the synthesis of this unsaturated epoxy ester resin, the formed unsaturated epoxy ester resin will be obtained as a solution in the alcoholic solvent. Therefore, the reaction of the unsaturated epoxy ester compound and the aliphatic tertiary amine can be run in the presence of alcoholic solvent, by merely adding the aliphatic tertiary amine to run the reaction without adding a fresh alcoholic solvent.

The photosensitive unsaturated ester compound of this invention obtained by the above-described reaction shows excellent photopolymerizability due to the presence of an unsaturated ester side group and excellent water solubility due to the presence of a quaternary ammonium salt.

The photosensitive resin composition of this invention can be prepared by mixing a photopolymerization inhibitor in the photosensitive unsaturated ester compound of this invention. Examples of the photosensitive polymerization initiator that can be used in the photosensitive resin composition of this invention are quinone such as 2-ethylanthraquinone, 2-butylanthraquinone, octamethylanthraquinone; α-ketaldonyl alcohols or ethers such as benzoin ether, pivaloin ether, acyloin ether and so on; and ketone such as α-phenyl benzoin, α,α'-diethoxy acetophenone, benzophenone, α,α'-dimethyoxy-α-thiophenyl acetophenone, diethyl thioxanthone and so on. These compounds may be used alone or as a mixture of two or more. The amount of such photopolymerization initiator to be used, based on 100 parts by weight of the photosensitive unsaturated ester compound is 1–50 parts by weight, preferably 2–20 parts by weight.

And, for the purpose of further improving the bondability, water-resistance and mechanical strength of the composition, amino resin or blocked isocyanate may be included as the thermal curing agent in the photosensitive resin composition of this invention. In this case, the amino resin is an initial condensation product obtained by reacting aldehyde with an amino group-containing compound such as melamine, urea or benzoguanamine. Examples are trimethylol melamine, tetramethylol melamine, hexamethylol melamine, hexamethoxy methylol melamine, melamine resins such as MW-30, MW-30M, MW-22, MX-025, MX-031, and MX-041 from Sanwa Chemical K.K. In case of using these amino resins, it is desirable to add an acid for the purpose of enhancing the reaction of the amino resin and the photosensitive unsaturated ester compound. Inorganic acids such as phosphoric acid, hydrochloric acid or sulfuric acid may be used as the acid to be used for such purpose. However, organic acids such as para-toluene sulfonic acid are more suitable because they do not corrode the metal. Examples of the blocked isocyanate that can be used as the thermal curing agent in the composition of this invention are blocked tolylene diisocyanate, blocked methylene diisocyanate, and blocked hexamethylene diisocyanate. The preferred ratio, by weight, of the photosensitive unsaturated ester compound and the amino resin or blocked isocyanate is 95:5–50:50.

Furthermore, neutral water or alcoholic compounds, which are relatively free of problems from the safety standpoint, may be used as the diluent to adjust the viscosity of the photosensitive composition of this invention. Examples of the alcoholic diluent that can be used for such purpose are diethyleneglycol monoethyl ether, diethyleneglycol monomethyl ether, ethyleneglycol monoethyl ether, ethyleneglycol monomethyl ether, and ethyleneglycol monobutyl ether, which are the solvents being used in the synthesis of the unsaturated epoxy ester compound.

And, to further improve the photocurability of the composition, a photopolymerizable monomer may be added in the composition. Preferably, the amount of the photopolymerizable monomer to be added is no higher than 50 weight %, based on the amount of the photosensitive unsaturated ester compound. Examples of the photopolymerizable monomers that can be used for such purpose are 2-hydroxethyl acrylate, 2-hydroxypropyl acrylate, N-vinyl pyrrolidone, acrylyl morpholine, methoxytetraethyleneglycol acrylate, methoxypolyethyleneglycol acrylate, polyethylenegylcol diacrylate, N, n-dimethyl acrylamide, N-methylol acrylamide, N, N-dimethylaminopropyl acrylamide, N, n-dimethylaminoethyl acrylate, melamine acrylate, diethyleneglycol diacrylate, triethylenegylcol diacrylate, propyleneglycol diacrylate, dipropyleneglycol diacrylate, tripopyleneglycol diacrylate, polypropyleneglycol diacrylate, phenoxyethyl acrylate, tetrahydrofurfuryl acrylate, cylohexyl acrylate, trimethylolpropane triacrylate, glcyerindiglycidyl ether diacrylate, pentaerythritol triacrylate, pentaerythritol tetracrylate, pentaerythritol pentacrylate, pentaerythritol hyxacrylate, dipentaerythritol pentacrylate, depentaerythritol hexacryalte and its methacrylate, and they may be used alone or as a mixture.

Furthermore, additives known in this technological field, like the fillers such as barium sulfate, silica, talc, clay, alumina, and aluminum hydroxide; coloring agents such as phthalocyanine green, titanium oxide, and carbon black; leveling agents such as silicone oil; bonding promotors; UV absorbers may be added, if necessary, to the photosensitive resin composition of this invention.

Because the photosensitive resin composition of this invention prepared in the above-described manner contains quaternary ammonium salt, it can be developed with neutral water and neutral aqueous medium can be used. Therefore, the present invention can solve the difficulties such as odors, air pollution, and effects on human health which have been the problems with the conventional solder mask and, in addition, the present invention can provide a coating which excels in heat resistance, water resistance and mechanical strength.

Preferred embodiments of this invention are explained further in detail byway of the following Syntheses, Examples and Comparative Examples. These examples illustrate the practical embodiment of this invention and are not intended to limit the scope of this invention.

SYNTHESIS OF UNSATURATED EPOXY ESTER COMPOUNDS

Synthesis I

After dissolving cresol Novolak type epoxy resin YDCN-702 (a product of Toro Kasei K.K., epoxy equivalent weight=200, average molecular weight=1400) 200 g was dissolved in diethyleneglycol monoethyl ether 150 g and then adding hydroquinone 0.05 g as the polymerization inhibitor, acrylic acid 61.2 g (0.85 mol) and tetraethylammonium bromide 3.5 g were added. While air was introduced, the esterification reaction was carried out at 90° C. To determine the end point of the reaction, the reaction mixture was titrated with an alcoholic potassium hydroxide solution using phenolphthalein as the indicator. When the acid value reached zero (0), it was regarded as the end point of the reaction. A faint brown liquid product 414.7 g was obtained as a solution in the alcoholic solvent (yield=100%). The result of the IR analysis showed the presence of a peak near 1730 cm$^{-1}$, which is attributable to the C=O absorption of ester group. When the concentration of residual epoxy group in the product was determined by the method specified in JIS 7236-1986, it was 0.15 mol.

Synthesis 2

After dissolving cresol Novolak type epoxy resin YDCN-704 (a product of Toto Kasei K.K., epoxy equivalent weight=200, average molecular weight=1800) 200 g in diethylenegylcol monoethyl ether 150 g and adding hydroquinone 0.05 g as the polymerization inhibitor, acrylic acid 57.6 g (0.8 mol) and tetraethylammonium bromide 3.5 g were added. While air was introduced, the exterification reaction was carried out at 90° C. To determine the end point of the reaction, the reaction mixture was titrated with an alcoholic potassium hydroxide solution using phenolphthalein as the indicator. The end point of the reaction was when the acid value reached zero (0). A faintly brown liquid product 411.1 g was obtained (yield=100%). The result of the IR analysis showed a peak near 1730 cm$^{-1}$ which can be attributed to C=O absorption of ester group. When the concentration of the residual epoxy group in the product was determined in the same manner as in Synthesis 1, it was 0.20 mol.

Synthesis 3

After dissolving phenol Novolak type epoxy resin EOON-201 (a product of Nippon Kayaku K.K., epoxy equivalent weight=180, average molecular weight=1300) 180 g in diethyleneglycol monoethyl ether 100 g and adding hydroquinone 0.05 g as the polymerization inhibitor, acrylic acid 57.6 g (0.8 mol) and tetraethylammoniumbromide 2.8 g were added. While air was introduced, the esterification reaction was carried out at 900° C. The end point of the reaction was when the acid value reached zero (9), by titration with an alcoholic potassium hydroxide solution using phenolphthalein as the indicator. A faintly brown liquid product 340.9 g was obtained (yield=100%). The result of the IR analysis showed a peak near 1730 cm$^{-1}$, which can be attributed to the C=O absorption of ester group. When the concentration of residual epoxy group in the product was determined in the same manner as in Synthesis 1, it was 0.20 mol.

Synthesis 4

After dissolving cresol Novolak type epoxy resin YDCN-702 (a product of Toto Kasei K.K., epoxy equivalent weight=200, average molecular weight=1400) 200 g in dithyleneglycol monoethyl ether 150 g and adding hydroquinone 0.05 g as the polymerization inhibitor, acrylic acid 70.56 g (0.98 mol) and tetraethylammonium bromide 3.5 g were added. While air was introduced, the esterification reaction was carried out at 90° C. The end point of the reaction was when the acid value reached zero (0), by titration with an alcoholic potassium hydroxide solution using phenolphthalein as the indicator. A faintly brown liquid product 424.1 g was obtained (yield=100%). The result of the IR analysis showed a peak near 1730 cm$^{-1}$, which can be attributed to the C=O absorption of the ester group. The concentration of residual epoxy group in the product was determined in the same manner as in synthesis 1, and it was 0.02 mol.

Synthesis 5

A faintly brown liquid product 414.7 g was obtained (yield =100%) by the same procedure as in Synthesis 1, except that as a non-alcoholic solvent, diethyleneglycol monoethyl ether acetate 150 g was used instead of the diethyleneglycol monoethyl ether 150 g. The end point of the reaction was when the acid value reacted zero (0), by titration with an alcoholic potassium hydroxide solution using phenolphthalein as the indicator. The result of the IR analysis showed a peak near 1730 cm$^{-1}$, which can be attributed to the C=O adsorption of ester group. When the concentration of residual epoxy group in the product was determined in the same manner as in Synthesis 1, it was 0.15 mol.

SYNTHESIS OF UNSATURATED EPOXY ESTER COMPOUND HAVING QUATERNARY AMMONIUM SALT

Synthesis 6

Dimethyl ethanolamine 13.35 g was added to the unsaturated epoxy ester compound 414.75 g in the form of a solution of an alcoholic solvent as obtained in Synthesis 1, and the reaction was carried out at 50° C. for 24 hours to react the residual epoxy group of the epoxy ester compound, to obtain 428.05 g of an unsaturated epoxy ester compound of this invention containing an epoxy ester side group and a quaternary ammonium salt, as a faintly brown, uniform liquid product (yield=100%). When the product was subjected to IR analysis, the adsorption near 910 cm$^{-1}$ due to epoxy group was no longer detected. This product was called "Compound 1". This compound could be diluted with water.

As illustrated in Table 1, the unsaturated epoxy ester compounds as obtained in Syntheses 1–4 were combined with a variety of amines to react with the residual epoxy group of the unsaturated epoxy ester compound, and homogeneous liquid compounds 2–6 were obtained.

Comparative Example 1

Dimethyl ethanolamine 13.35 g was added to 414.7 g of a solution of the unsaturated epoxy ester compound as obtained in Synthesis 5 in a non-alcoholic solvent, and they were reacted at 50° C. Because the formed unsaturated epoxy ester compound having a quaternary ammonium salt was insoluble in the solvent, the product separated into two phases, and thus a homogenous liquid product could not be obtained. Further, this compound could not be diluted with neutral water.

Example 1

IRGACURE 907 (a product of Ciba-Geigy Co., α,α'-dimethoxy-α-morpholino-methyl thiophenyl acetophenone) 23 g and DETX (a product of Nippon Kayaku K.K., diethyl thioxanthone) 2.3 g as the photopolymerization initiator, amino resin (a product of Sanwa Chemicals K.K., MW-30, a derivative of the condensation product of melamine and formaldehyde) 24 g as the hardener, para-toluene sulfonic acid 2 g as the curing catalyst, trimethylolpropane triacrylate (Toa Gosei K.K., M-309) 24 g, and silicone oil (a product of Toshiba Silicone K.K., TSA-750S) 5 g as the defoaming agent were added to 428.05 g of the Compound 1, to prepare a photosensitive resin composition of this invention.

Examples 2–5, Comparative Example 2

A variety of photosensitive resin compositions of this invention and a composition for comparison were prepared by using a variety of components shown in Table 2 by following the same procedure, and the properties of each composition were evaluated. Thus, the prepared photosensitive resin composition was coated on a printed circuit substrate to form a film having a thickness of 20–30 μm by using a screen printer, and then it was dried at 80° C. for 20 minutes, to form a resist layer. It was exposed to UV light through a negative film which was contacted closely on the resist layer (condition for exposure of UV light: 500 mj/cm$^2$), and then the unexposed area was developed by spraying with neutral water by applying a pressure of 2 kg/cm$^2$. Then, the formed image was thermally cured at 150° C. for 30 minutes. Pencil hardness of the thus-obtained image was determined by scratching a series of pencils having increasing hardness across the surface of the resist film until one lead mars the surface. The hardness of the pencil that made the first mark gives the film hardness. The pencils used for the test were Mitsubishi UNIPENCILS. To determine the bondability, the film was cross cut, and a cellophane tape was contacted with the surface of the film, and then peeled to separate. The number of squares remained out of the 100 squares was counted. To test water resistance (boiling test), the sample was kept in 100° C. boiling water for 1 hour, and then the external appearance (swelling, whiteness, etc.) of the resist film was examined by naked eyes. To test the heat resistance, the sample was kept in a 260° C. solder bath for 20 seconds, and then the external appearance (bulging, delamination) of the resist film was examined visually.

Compared to the resin composition obtained in Comparative Example 2, the resin compositions obtained in Examples 1–5 showed excellent developability and dilutability with neutral water, and they formed resist films that excelled in hardness, heat resistance and water resistance.

TABLE 1

| Synthesis of Unsaturated Epoxy Ester Compounds Having Quaternary Ammonium Salt | | | | | | |
|---|---|---|---|---|---|---|
| | 1 | 2 | 3 | 4 | 5 | 6 |
| Unsaturated epoxy ester (g) | | | | | | |
| Synthesis 1 | 414.7 | 414.7 | | | | |
| Synthesis 2 | | | 411.1 | 411.1 | | |
| Synthesis 3 | | | | | 340.9 | |
| Synthesis 4 | | | | | | 424.1 |
| Amine (g) | | | | | | |
| Amine 1 | 13.35 | | 17.8 | | 17.8 | 17.8 |
| Amine 2 | | 14.85 | | | | |
| Amine 3 | | | | 20.2 | | |
| Reaction condition | | | 50° C., 24 hours | | | |

Footnotes:
Amine 1: N,N-Dimethyl ethanolamine
Amine 2: N-Methyl piperidine
Amine 3: N-Methyl morpholine

TABLE 2

Photosensitive Resin Compositions and Their Properties

| | Examples | | | | | Comp. |
|---|---|---|---|---|---|---|
| Unsaturated epoxy ester (g) | 1 | 2 | 3 | 4 | 5 | Example 2 |
| | Compounds | | | | | |
| | 1 | 2 | 3 | 4 | 5 | 6 |
| | 428.05 | 429.55 | 428.9 | 431.3 | 358.7 | 425.88 |
| Photopolymerization initiator | | | | | | |
| IRGACURE 907 | 23 | 23 | 23 | 23 | 23 | 23 |
| DETX | 2.3 | 2.3 | 2.3 | 2.3 | 2.3 | 2.3 |
| Defaoming agent (g) TSA-750S | 5 | 5 | 5 | 5 | 5 | 5 |
| Amino resin (g)  MW-30 | 24 | 24 | 0 | 0 | 0 | 24 |
| MW-22 | 0 | 0 | 24 | 0 | 0 | 0 |
| Blocked isocyanate (g) | 0 | 0 | 0 | 30 | 0 | 0 |
| Curing catalyst (g) PTS | 2 | 2 | 2 | 0 | 0 | 2 |
| M-309 (g) | 24 | 24 | 24 | 24 | 24 | 24 |
| Water developability (30 sec.) | Good | Good | Good | Good | Good | Poor |
| Dilutability in neutral water | Good | Good | Good | Good | Good | Poor |
| Pencil hardness | 4H | 4H | 4H | 4H | 4H | 4H |
| Bondability (crosscut/100) | 100 | 100 | 100 | 100 | 100 | 100 |
| Heat resistance | Good | Good | Good | Good | Good | Good |
| Boiling test | Good | Good | Good | Good | Good | Good |

IRGACURE 907: A product of Ciba-Geigy Co., α,α-dimethyoxy-α-morpholino-methyl-thiophenyl acetophenone
DETX: A product of Nippon Kayaku K.K., diethyl thioxanthone
TSA-750S: A product of Toshiba Silicone K.K., silicone oil
MW-30: A product of Sanwa Chemical K.K., a derivative of the condensation product of melamine and formaldehyde
MW-22: A product of Sanwa Chemical K.K., a derivative of the condensation product of melamine and formaldehyde
Blocked isocyanate: A product of Nippon Polyurethane Kogyo K.K., CORONATE AP Stapl (tolylene diisocyanate type)
PTS: Para-toluene sulfonic acid
M-309: A product of Toa Gosei K.K., trimethylolpropane triacrylate

We claim:

1. A photosensitive resin composition which comprises:
   (A) a photosensitive unsaturated ester compound having an unsaturated ester group and a quaternary ammonium salt obtained by the reaction of (a) a partial esterification product of the reaction of a glycidyl ether epoxy compound selected from the group consisting of a phenol Novolak type epoxy resin, a cresol Novolak type epoxy resin and a bisphenol A type epoxy resin, with a polymerizable monocarboxylic acid having one carboxyl group and one ethylenically unsaturated linkage in the molecule, said product being an unsaturated epoxy ester compound having an unsaturated ester group and an unreacted epoxy group, with (b) an aliphatic tertiary amine in the presence of an alcoholic solvent; and
   (B) a photopolymerization initiator.

2. The photosensitive resin composition according to claim 1 further comprising an amino resin or a blocked isocyanate as the curing agent.

3. The photosensitive resin composition according to claim 1, wherein said polymerizable monocarboxylic acid is selected from the group consisting of acrylic acid, methacrylic acid, crotonic acid and cinnamic acid.

4. The photosensitive resin composition according to claim 3, wherein the polymerizable monocarboxylic acid is acrylic acid.

5. The photosensitive resin composition according to claim 1, wherein said aliphatic tertiary amine is selected from the group consisting of N,N-dimethyl ethanolamine, N-methyl diethanolamine, N-methylpeperidine, N-methylmorpholine and N,N-dimethylamino-propyl acrylamide.

6. The photosensitive resin composition according to claim 5, wherein the aliphatic tertiary amine is N,N-dimethyl ethanolamine.

7. The photosensitive resin composition according to claim 5, wherein the aliphatic tertiary amine is N-methylpiperidine.

8. The photosensitive resin composition according to claim 5, wherein the aliphatic tertiary amine is N-methylmorpholine.

9. A method of preparing a photosensitive resin composition which comprises:
   (A) reacting a glycidyl ether epoxy compound selected from the group consisting of a phenol Novolak type epoxy resin, a cresol Novolak type epoxy resin and a bisphenol A type epoxy resin with a polymerizable monocarboxylic acid having one carboxyl group and one ethylenically unsaturated linkage in the molecule to esterify part of the epoxy group to give an unsaturated epoxy ester compound having an unsaturated ester group and unreacted epoxy group;
   (B) reacting the unreacted epoxy group of the unsaturated epoxy ester compound with an aliphatic tertiary amine in the presence of an alcoholic solvent to convert the unreacted epoxy group into a quaternary ammonium base to give a photosensitive unsaturated ester compound having an unsaturated ester group and a quaternary ammonium salt; and
   (C) mixing the photosensitive unsaturated ester compound with a photopolymerization initiator.

10. The method according to claim 9 further comprising adding a curing agent selected from an amino resin and a blocked isocyanate compound to the photosensitive resin composition obtained in step (C).

* * * * *